US012701367B2

(12) United States Patent
Leschka et al.

(10) Patent No.: US 12,701,367 B2
(45) Date of Patent: Aug. 4, 2026

(54) ELECTRET MICROPHONE

(71) Applicant: Sennheiser electronic SE & Co. KG, Wedemark (DE)

(72) Inventors: Stephan Leschka, Potsdam (DE); Wolfgang Dreßler, Berlin (DE)

(73) Assignee: Sennheiser electronic SE & Co. KG, Wedemark (DE)

( * ) Notice: Subject to any disclaimer, the term of this patent is extended or adjusted under 35 U.S.C. 154(b) by 174 days.

(21) Appl. No.: 18/203,974

(22) Filed: May 31, 2023

(65) Prior Publication Data

US 2023/0396932 A1     Dec. 7, 2023

(30) Foreign Application Priority Data

Jun. 3, 2022     (DE) .......................... 102022114130.6

(51) Int. Cl.
H04R 19/01        (2006.01)
H03K 17/60        (2006.01)
H04R 3/00         (2006.01)

(52) U.S. Cl.
CPC ........... H04R 19/016 (2013.01); H03K 17/60 (2013.01); H04R 3/007 (2013.01)

(58) Field of Classification Search
CPC ........ H04R 19/016; H04R 3/007; H04R 3/06; H04R 25/502; H04R 25/456; H04R 19/04; H03K 17/60; H03F 1/223; H03F 1/26; H03F 3/185; H03F 1/3264; H03F 1/32; H03F 3/187; H03F 2200/03; H03F 1/56; H03F 3/181; H03F 3/1855; H03F 2200/372; H03F 2200/54; H03F 3/345; H03F 3/505; H03F 3/45479

See application file for complete search history.

(56) References Cited

U.S. PATENT DOCUMENTS 3,300,585 A * 1/1967 Reedyk .................. H04R 19/04
                                                        330/3
3,569,747 A * 3/1971 Siegel .................. B06B 1/0651
                                                        310/329

(Continued)

OTHER PUBLICATIONS

Search Report dated May 9, 2023 issued in the corresponding German application.

*Primary Examiner* — Angelica M Mckinney
(74) *Attorney, Agent, or Firm* — Haug Partners LLP; Jon E. Gordon

(57)        ABSTRACT

An electret microphone includes a microphone capsule with an output connection, a first input connection as an earth connection and a second input connection for providing a supply voltage and for leading out a microphone output signal. A cascode includes first and second transistors, wherein the microphone capsule's output is input to the cascode. The second transistor is an FET having a gate coupled to the microphone capsule's output connection and a drain coupled to the first transistor's emitter when bipolar or source when a FET. A third transistor, which is bipolar has an emitter coupled to the second input connection, a collector coupled via a capacitor to earth, and a base coupled via a resistance to the second input connection and the first transistor's collector when bipolar or drain when a FET, wherein a resistance exists between the second transistor's drain and the third transistor's collector.

10 Claims, 3 Drawing Sheets

(56)                    References Cited

U.S. PATENT DOCUMENTS 3,993,869  A  *  11/1976  Kono  .................... H03F 3/1855
                                                            330/264
    4,577,160  A  *   3/1986  Lettvin  .................... H03F 1/26
                                                            330/261
    5,083,095  A  *   1/1992  Madaffari  ............... H03F 3/505
                                                            330/277
    5,337,011  A       8/1994  French et al.
    5,589,799  A  *  12/1996  Madaffari  ............. H03F 3/1855
                                                            330/277
    7,830,210  B2 *  11/2010  Onodera  .................. H03F 1/32
                                                            330/149
 2010/0102886  A1 *   4/2010  Onodera  ................ H03F 3/187
                                                            330/277

* cited by examiner

ELECTRET MICROPHONE

CROSS REFERENCE TO RELATED APPLICATIONS

This application claims priority under 35 U.S.C. § 119(b) to German Patent Application No. 102022114130.6, filed Jun. 3, 2022, the entirety of which is herein incorporated by reference.

FIELD OF DISCLOSURE

The present invention relates to an electret microphone.

BACKGROUND

An electro-acoustic capacitor microphone comprises a movable, thin, electrically conducting membrane (first electrode) and a fixed second electrode (counter-electrode). The membrane can either be metallic or non-metallic and can be provided with an electrically conducting coating on one or both sides. The electrode and the counter-electrode are located at a short distance from one another with an interposed air gap. An electret microphone has an electret layer between the electrode and the counter-electrode in order to generate the necessary electric field between the electrode and the counter-electrode.

U.S. Pat. No. 5,337,011 describes an electret microphone and a pre-amplifier for the electret microphone. The pre-amplifier comprises an input cascode, a compensating cascode and a differential amplifier.

SUMMARY OF THE INVENTION

It is the object of the present invention to provide an electret microphone which has a low output impedance, a low distortion factor and a low noise.

This object is achieved by an electret microphone according to Claim 1.

Thus, an electret microphone is provided, comprising a microphone capsule with an output connection, a first input connection as an earth connection and a second input connection for providing a supply voltage for the microphone capsule and for leading out a microphone output signal of the microphone capsule, and a cascode consisting of a first and second transistor. An output connection of the microphone capsule is provided as input of the cascode. The second transistor is configured as a field effect transistor FET and the gate connection thereof is coupled to the output connection of the microphone capsule. A drain connection of the second transistor is coupled to an emitter connection of the first transistor as bipolar transistor or to a source connection of the first transistor as an FET transistor. Furthermore, a third transistor is provided as bipolar transistor, whose emitter connection is coupled to the second input connection. A collector connection of the third transistor is coupled via a capacitor to earth. A base connection of the third transistor is coupled via a resistance to the second input connection. The base connection of the third transistor is coupled to a collector connection of the first transistor as bipolar transistor or to a drain connection of the first transistor as FET transistor. A resistance is coupled between the drain connection of the second transistor and the collector connection of the third transistor.

According to one aspect, a resistance is provided between a source connection of the second transistor and an earth connection.

According to one aspect, the resistance is configured as a temperature-dependent resistance. Temperature fluctuations can thus be compensated.

According to one aspect, a series circuit is provided comprising a capacitor and a resistance between the base connection of the transistor and the second input connection of the electret microphone.

According to one aspect, a capacitor is provided between the source connection of the second transistor and the earth connection.

According to one aspect, a capacitor is provided between the output connection of the microphone capsule and the second input connection.

According to one aspect, the first transistor is configured as a bipolar transistor. Furthermore, a resistance is provided between the base connection of the first transistor and the second input connection and a series circuit comprising at least one diode and a resistance between the base connection of the first transistor and the source connection of the second transistor.

An electret microphone is further provided comprising a microphone capsule with an output connection, a first input connection as earth connection and a second input connection for providing a supply voltage for the microphone capsule and for leading out a microphone output signal of the microphone capsule and a cascode consisting of a first and a second transistor. An output connection of the microphone capsule is provided as input of the cascode. The second transistor is configured as a field effect transistor FET and its gate connection is connected to the output connection of the microphone capsule. A drain connection of the second transistor is coupled to an emitter connection of the first transistor as a bipolar transistor or to a source connection of the first transistor as an FET transistor. A third transistor is configured as a self-locking field effect transistor. The third connection thereof is coupled to the second input terminal. A second connection of the third transistor is coupled via a capacitor to earth. A gate connection is coupled as first connection of the third transistor via a resistance to the second input terminal. The gate connection of the third transistor is coupled to a collector connection of the first transistor as a bipolar transistor or to a drain connection of the first transistor as an FET transistor. A resistance is coupled between the drain connection of the second transistor and the second connection of the third transistor.

According to one aspect, a protective circuit comprising a diode, a series circuit comprising a resistance and a coil and a capacitor is provided between the second input connection and the elements coupled thereto. Thus, a protective circuit can be inserted between the nodes 104 (i.e. the capacitor C6), 105 (i.e. the resistance R1), 116 (i.e. the resistance R12), 116 (i.e. the third transistor T3) and the second input connection. If in one of the above aspects, an element of the microphone is coupled to the second input connection, the protective circuit can then be provided between this element and the second input connection.

According to one aspect, a coil is provided between the earth connection and the capacitor.

The electret microphone comprises an electret microphone capsule, a first and second connection and a cascode consisting of at least two transistors, wherein one of the transistors is coupled to an output connection of the microphone capsule.

The cascode comprises a first and second transistor. The first transistor can be configured as a bipolar transistor or as a FET transistor. The second transistor is configured as an FET transistor. A gate connection of the second transistor is coupled to the output connection of the microphone capsule. In addition to the two transistors in the cascode, a third transistor and a capacitor are coupled in series between the second input connection and the first input connection as earth connection. The collector or the drain connection of the first transistor can be coupled to the second input connection via a resistance. A resistance is provided between a collector connection of the third transistor and a drain connection of the second transistor.

As a result of the configuration of the circuit comprising the first and third transistor which are each coupled to the second input connection, it is achieved that almost the entire current flowing via the second input connection, for example, as a result of an adjoining phantom feed, flows low-pass-filtered almost as a direct current completely via the drain connection of the second transistor. Accordingly, substantially the entire current flows from the second input connection via the second transistor. Thus, an electret microphone can be achieved which has lower inherent noise.

According to one aspect of the present invention, the electret microphone can be coupled via a microphone cable, for example, to a wireless pocket transmitter. Earth can be applied to a first connection of the electret microphone and a supply voltage can be applied to a second connection.

Via the microphone cable the electret microphone can be supplied with a phantom voltage (for example, between 5 and 10 volts) from the pocket transmitter. The first connection of the electret microphone is connected via earth and the second connection is connected to the phantom voltage. The recorded audio signal can also be output via the second connection.

According to one aspect of the present invention, with the electret microphone a maximization of the dynamics with reduced noise is provided with a maximum controllability and low dynamic output resistance.

According to one aspect of the present invention, the AC current fed into the microphone as a result of the audio signal is fed as DC current through the second transistor T2. This results in a reduction of the inherent noise.

The electret microphone according to the invention can, for example, be used as an instrument microphone and can optionally cover a range from 23 dBA to 153 dBSPL.

According to one aspect of the present invention, due to the pre-amplifier of the electret microphone it is achieved that the entire current provided to the electret microphone via a phantom voltage flows substantially over the field effect transistor to whose gate the output of the microphone capsule is coupled.

According to one aspect of the present invention, a cascode consisting of the first and second transistor is provided, wherein a first transistor is coupled to the drain connection of the second transistor. The first transistor is coupled via a resistance to the second input connection of the electret microphone. The second input connection of the electret microphone serves to receive the current from the supply and output the audio signal. A third transistor, for example, a bipolar transistor is connected to a second connection of the electret microphone. A capacitor is provided between the third transistor and earth. A base connection of the third transistor is connected to a collector connection of a first bipolar transistor or to a drain connection of an FET connection. A resistance is provided between the collector of the third transistor and the drain connection of the second transistor, which can serve to reduce the noise.

Further configurations of the invention are the subject of the dependent claims.

BRIEF DESCRIPTION OF THE DRAWINGS

Advantages and exemplary embodiments of the invention are explained in detail hereinafter with reference to the drawings.

DETAILED DESCRIPTION

Figure 1:
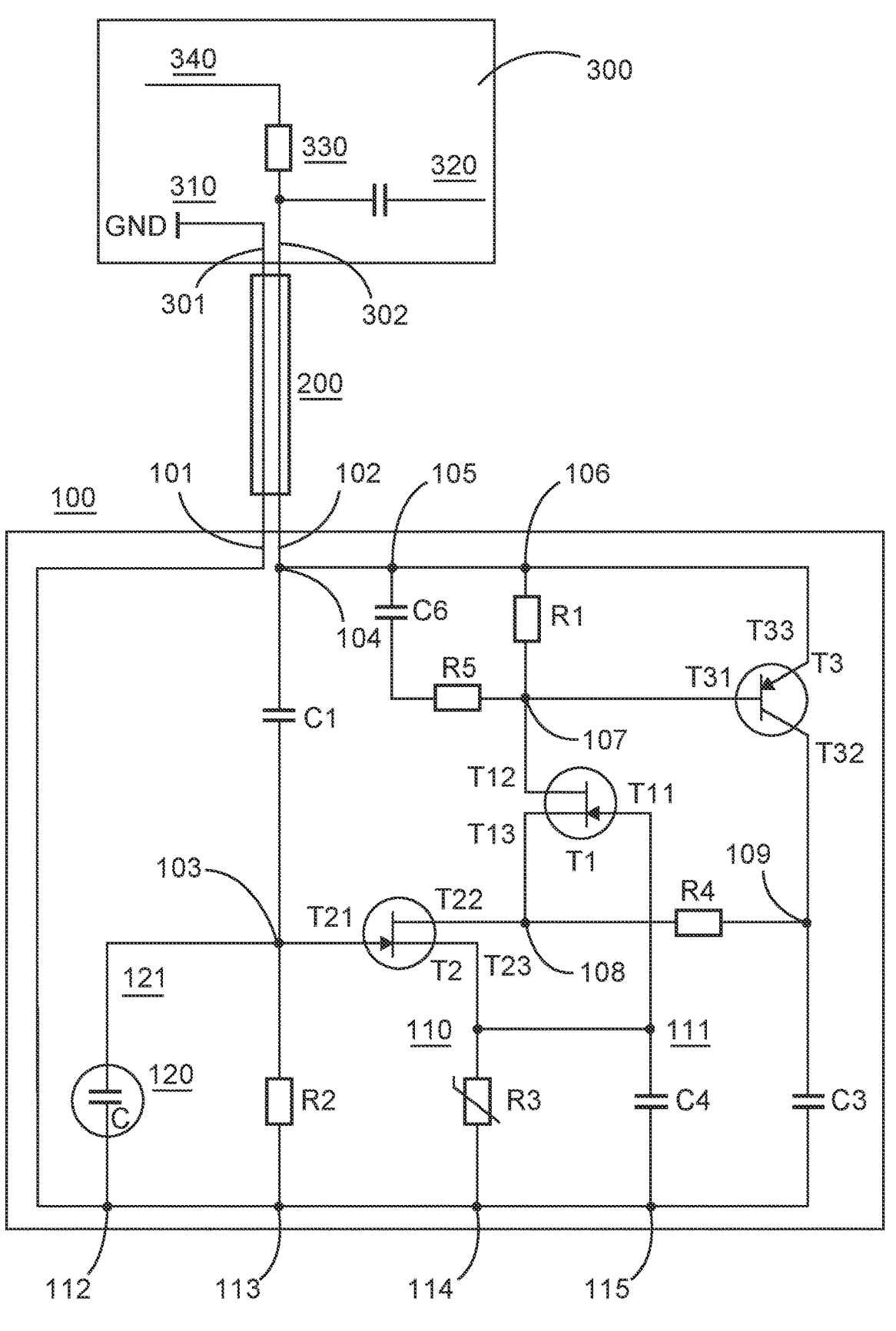
FIG. 1 shows a circuit diagram of an electret microphone according to a first exemplary embodiment.

FIG. 1 shows a circuit diagram of an electret microphone according to a first exemplary embodiment. In FIG. 1 an electret microphone 100 is coupled via a microphone cable 200, for example, to a wireless pocket transmitter 300. The electret microphone 100 has a first and second electrical connection 101, 102. Via the first electrical connection 101, the electret microphone 100 is coupled via the microphone cable 200 to a first connection 301, for example, of the pocket transmitter 300 which is again connected to earth 310. Via the second electrical connection 102, the electret microphone 100 is coupled via the microphone cable 200 to a second connection 302 of the pocket transmitter 300. The second connection 302 is coupled via a resistance 330 to a DC voltage supply 340. An audio output 320 is also coupled to the second connection 302 via a capacitor. Via the second connection 302 therefore both the DC voltage is provided for operation of the microphone amplifier circuit and also the audio output signal of the microphone amplifier circuit is output as an alternating component. The specific implementation of the device 300 to which the electret microphone 100 can be connected via the microphone cable 200, can differ from this structure.

The microphone 100 comprises a microphone capsule 120. A cascode comprising a first and second transistor T1, T2 is provided at the output connection 121 of the microphone capsule. In FIG. 1 the first transistor is configured as an FET transistor.

In the electret microphone 100 the first electrical connection 101 is electrically coupled to the nodes 112, 113, 114, 115 as earth connection. The second electrical connection 102 for providing a voltage supply (phantom voltage) and simultaneous return of the audio output signal is coupled to the nodes 105, 106. A microphone capsule 120 is coupled to a node 103 and to the node 112. The node 103 forms the output connection 121 of the microphone capsule 120. A capacitor C1 is provided between the node 103 and a node 104 at the second electrical connection 102. A resistance R2 is provided between the node 103 and the node 113 (earth).

The second transistor T2 comprises a gate connection T21, a drain connection T22 and a source connection T23. The first transistor T1 comprises (as a bipolar transistor) a base connection (T11), a collector connection (T12) and an emitter connection (T13). The first transistor T1 as an FET transistor comprises a gate connection T11, a drain connection T12 and a source connection T13.

Furthermore, the transistor T2 is coupled to the node 103 and therefore to the output of the microphone capsule 120. The output signal of the microphone capsule 120 is therefore the input signal for the gate T21 of the FET transistor T2. The transistor T2 is coupled via the drain connection T22 to the node 108 via the source connection to the node 110. The node 110 is coupled to a node 111. A (e.g. temperature-dependent) resistance R3 is provided between the node 110 and the node 114. A capacitor C4 is provided between the node 111 and the node 115. The node 111 is also coupled to a gate connection T11 of a transistor T1. The source connection T13 of the transistor T1 is coupled to the drain connection T22 of the transistor T2 via the node 108. The drain connection T12 of the transistor T1 is coupled to a node 107. A resistance R1 is provided between the node 107 and the node 106. A series circuit comprising a capacitor C6 and a resistance R5 can be provided in parallel, i.e. between the node 107 and the node 105. A resistance R4 is provided between the node 108 and the node 109. A capacitor C3 is provided between the node 109 and the node 115. A base connection T31 of a transistor T3 is coupled to the node 107. The emitter connection T33 of the transistor T3 is coupled to the node 106. The collector connection T32 is coupled to the node 109.

Figure 2:
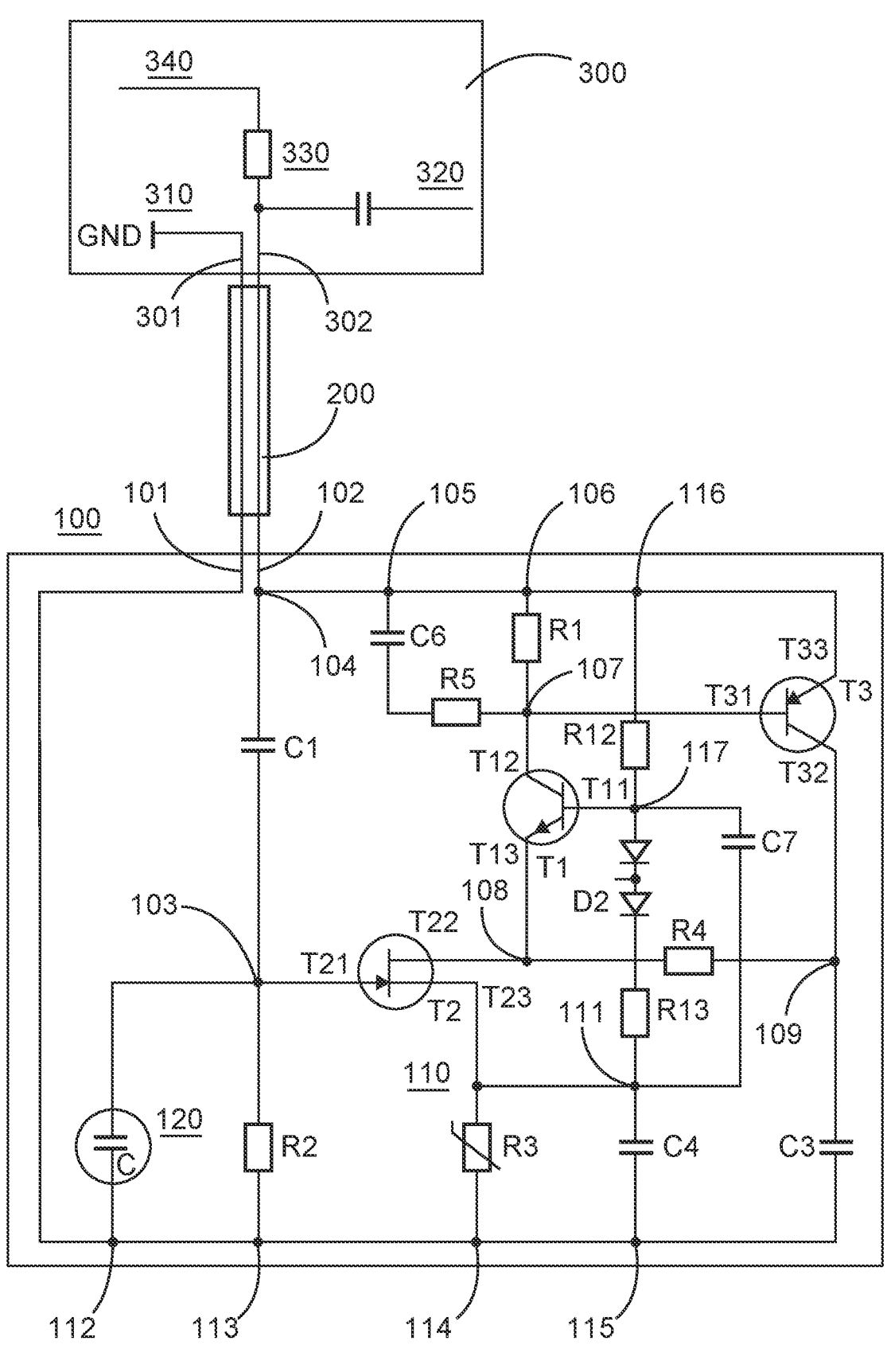
FIG. 2 shows a circuit diagram of an electret microphone according to a second exemplary embodiment and FIG. 3 shows a circuit diagram of an electret microphone according to a third exemplary embodiment.

FIG. 2 shows a circuit diagram of an electret microphone according to a second exemplary embodiment. In FIG. 2 an electret microphone 100 is coupled via a microphone cable 200, for example, to a wireless pocket transmitter 300. The electret microphone 100 has a first and a second electrical connection 101, 102. Via the first electrical connection 101 the electret microphone 100 is coupled via the microphone cable 200 to a first connection 301 of the pocket transmitter 300 which in turn is connected to earth 310. Via the second electrical connection 102 the electret microphone 100 is coupled via the microphone cable 200 to, for example, a second connection 302 of the pocket transmitter 300. The second connection 302 is coupled to a DC voltage supply 340. An audio output 320 is also coupled to the second connection 302.

The microphone 100 comprises a microphone capsule 120 with an output connection 121. A cascode comprising a first and second transistor T1, T2 is provided at the output connection of the microphone capsule. In FIG. 2 the second transistor T2 is configured as a bipolar transistor.

In the electret microphone 100 the first electrical connection 101 as earth connection is electrically coupled to the nodes 112, 113, 114, 115. The node 103 forms the output connection of the microphone capsule. The second electrical connection 102 for providing a voltage supply (phantom voltage) and simultaneous return of the audio output signal is coupled to the nodes 105, 106. A microphone capsule 120 is coupled to a node 103 and to the node 112. A capacitor C1 is provided between the node 103 and a node 104 at the second electrical connection 102. A resistance R2 is provided between the node 103 and the node 113. Furthermore, second FET transistor T2 is coupled to the node 103 and therefore to the output connection 121 of the microphone capsule 120. The output signal of the microphone capsule 120 is therefore the input signal for the gate connection T21 of the FET transistor T2. The second transistor T2 is coupled via the drain connection T22 to the node 108 via the source connection T23 to the node 110. The node 110 is coupled to a node 111. A (e.g. temperature-dependent) resistance R3 is provided between the node 110 and the node 114. A capacitor C4 is provided between the node 111 and the node 115. A resistance R1 is provided between the node 107 and the node 106. A series circuit comprising a capacitor C6 and a resistance R5 is provided in parallel, i.e. between the node 107 and the node 105. A resistance R4 is provided between the node 108 and the node 109. A capacitor C3 is provided between the node 108 and the node 109. A capacitor C3 is provided between the node 109 and the node 115. A base connection T31 of a bipolar transistor T3 is coupled to the node 107. The emitter connection T33 of the transistor T3 is coupled to the node 106. The collector connection T32 is coupled to the node 109.

The electret microphone according to the second exemplary embodiment further comprises a node 116 which is coupled to the node 106. The first transistor T1 is not configured as a field effect transistor but as a bipolar transistor. A base connection T11 of the transistor T1 is coupled to a node 117. A resistance R12 is provided between the node 116 and the node 117. A capacitor C7 is provided between the node 117 and the node 111. Parallel to this two diodes D2 are provided in series with a series-connected resistance R13. The resistance R12, the diodes D2, the capacitor C7 and the resistance R13 are used to control the bipolar transistor T1.

Both in the first and in the second exemplary embodiment a (temperature-dependent) resistance R3 is provided between the node 110 and earth 114. This resistance can be a PTC element to compensate for a temperature-dependent variation of the gate source voltage of the input of the JFET T2.

Both in the first and also in the second exemplary embodiment, the transistor T3 can alternatively be configured as a self-locking field effect transistor so that its base/emitter/collector connections are then replaced by corresponding gate/source/drain connections.

According to the first and second exemplary embodiment, the microphone 100 can be coupled via a cable 200 to a signal processing unit. The signal processing unit can, for example, be a pocket transmitter 300.

Figure 3:
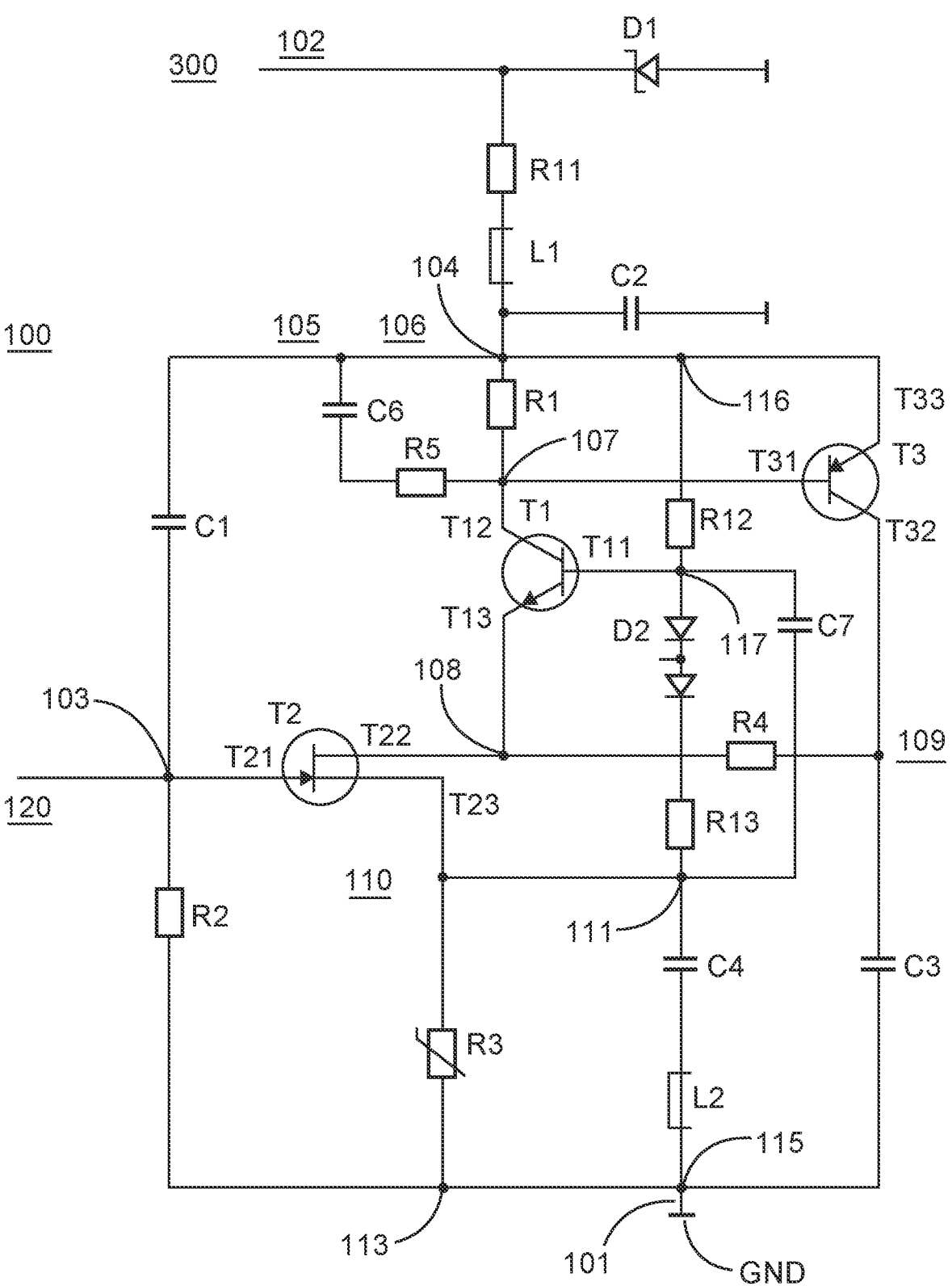

FIG. 3 shows a circuit diagram of an electret microphone according to a third exemplary embodiment. The electret microphone from FIG. 3 is based on the electret microphone from FIG. 2. In addition to the circuit elements from FIG. 2, the electret microphone according to FIG. 3 has optional components for EMC and ESD protection. A Zener diode D1 is connected to the second electrical connection 102 for ESD protection, the other connection being connected to earth. For EMC protection, in additional to the elements contained in FIG. 2, a series circuit comprising a resistance R11 and a coil L1 is provided between the second electrical connection 102 and the node 104. The node 104 is additionally connected to earth via a capacitor C2. In addition to the capacitor C4, a coil L2 connected in series therewith is additionally provided between the nodes 111 and 115.

The said components which are provided in FIG. 3 in addition to the components contained in FIG. 2 can be added in the same way to the embodiment shown in FIG. 1. In both embodiments they are used to construct an ESD and EMC (minimizing the EMC sensitivity)—suitable microphone.

According to one aspect of the present invention, an inverting amplifier is provided which achieves an adjustable capacitive feedback via the capacitor C1 and the capacitance of the microphone capsule 120. A reduced output impedance is achieved due to the third transistor T3, the resistance R1, the resistance R5 and the capacitor C6.

According to one aspect of the present invention, the microphone capsule 120 requires the gate connection of the FET transistor T2 for the highest possible input impedance.

As a result of the configuration of the electret microphone 100 according to the first exemplary embodiment, it is achieved that almost the entire current flowing through the second connection 102 of the electret microphone 100 flows as DC current via the drain and source connections T22, T23 of the second transistor T2. Here a part of the current can flow from the node 104 via the node 105, the resistance R1 and the transistor T1 to the node 108. This part of the current via the first transistor T1 can, for example, be about 10% of the current which is fed via the second connection 102. Another, typically large part of the current can flow from the node 104, via the node 106, the transistor T3, the node 109 and the resistance R4 to the node 108. This part of the current via the third transistor T3 can, for example, be about 90% of the current which is fed via the second connection 102. In the node 108 the currents which have flowed via the first transistor T1 and the third transistor T3 thus come together. Then the entire current supplied via the second connection 102 flows as DC current through the transistor T2 and then via the resistance R3 to the nodes 112-115, i.e. to earth.

According to one aspect of the present invention this is achieved whereby a capacitor C3 is provided between the node 109 and the node 115 so that it can be avoided that the DC component of the current which flows through the third transistor T3 can flow directly to earth. To this end, the current which has flowed through the transistor T3 as a function of the audio signal is received by the capacitor C3 and the time average of the current flows as DC current via the resistance R4 and through the second transistor T2.

According to a further aspect of the present invention, the resistance R4 between the node 108 and the node 109 (i.e. between the drain connection of the transistor T2 and the collector connection of the transistor T3) serves to guide a significant component of the lowpass-filtered entire current from the second connection 102 which has flowed through the third transistor T3 as DC current through the second transistor T2 and thus minimize the noise of the second transistor T2.

The output of the microphone capsule 110 is coupled via the node 103 to a gate connection of the transistor T2 (which is configured as an FET).

According to one aspect of the present invention, a DC current which is provided via the microphone cable 200 can flow via the resistance R1, the transistor T1 to the drain of the field effect transistor T2. In addition to this, the low-pass-filtered alternating component of the entire current can flow as DC current via the third transistor T3, the node 109 and the resistance R4 to the drain connection T22 of the second transistor T2.

Since substantially the entire current which flows into the connection 102 into the circuit flows as smoothed DC current through the transistor T2, to the gate of which the microphone capsule is connected, this results in an appreciable reduction in the noise behaviour of the pre-amplifier of the electret microphone 100.

By providing the capacitor C3 which is coupled between the collector connection of the transistor T3 and earth, it can be avoided that a DC current flows to earth via this capacitor C3. On the contrary, the current which flows through the third transistor T3 is forced to flow low-pass-filtered and therefore almost as DC current via the resistance R4 to the drain connection T22 of the second transistor T2.

The second transistor T2 therefore has an almost constant operating point with regard to its drain-source voltage (through the cascode circuit) and thereby has almost the entire microphone input current flowing through it smoothed as DC current (through T3, C3, R4), with the result that both the noise and also the distortion factor of the circuit are minimized.

The invention claimed is:
1. An electret microphone, comprising:
a microphone capsule with an output connection;

a first input connection as an earth connection and a second input connection for providing a supply voltage for the microphone capsule and for leading out a microphone output signal of the microphone capsule; and a cascode consisting of a first and second transistor, wherein an output connection of the microphone capsule is provided as an input of the cascode, wherein the second transistor is configured as a field effect transistor (FET) and a gate connection thereof is coupled to the output connection of the microphone capsule, wherein a drain connection of the second transistor is coupled to an emitter connection of the first transistor as a bipolar transistor or to a source connection of the first transistor as a FET transistor, a third transistor as a bipolar transistor, whose emitter connection is coupled to the second input connection, wherein a collector connection of the third transistor is coupled via a third capacitor to the earth connection, wherein a base connection of the third transistor is coupled via a first resistance to the second input connection, wherein the base connection of the third transistor is coupled to a collector connection of the first transistor as a bipolar transistor or to a drain connection of the first transistor as a FET transistor, wherein a fourth resistance is coupled between the drain connection of the second transistor and the collector connection of the third transistor.

2. The electret microphone according to claim 1, further comprising:
a third resistance between a source connection of the second transistor and the earth connection.

3. The electret microphone according to claim 2, wherein the third resistance is configured as a temperature-dependent resistance.

4. The electret microphone according to claim 1, further comprising:
a series circuit comprising a sixth capacitor and a fifth resistance between the base connection of the third transistor and the second input connection of the electret microphone.

5. The electret microphone according to claim 1, further comprising:
a fourth capacitor between the source connection of the second transistor and the earth connection.

6. The electret microphone according to claim 5, wherein a coil is provided between the earth connection and the fourth capacitor.

7. The electret microphone according to claim 1, further comprising:
a first capacitor between the output connection of the microphone capsule and the second input connection.

8. The electret microphone according to claim 1, wherein the first transistor is configured as a bipolar transistor, further comprising:
a twelfth resistance between the base connection of the first transistor and the second input connection; and
a series circuit comprising at least one diode and a resistance between the base connection of the first transistor and the source connection of the second transistor.

9. The electret microphone according to claim 1, wherein a protective circuit comprising a first diode, a series circuit comprising an eleventh resistance and a first coil and a second capacitor is provided between the second input connection and the elements coupled thereto.

10. An electret microphone, comprising:

a microphone capsule with an output connection, a first input connection as an earth connection and a second input connection for providing a supply voltage for the microphone capsule and for leading out a microphone output signal of the microphone capsule; and a cascode consisting of a first and a second transistor, wherein the output connection of the microphone capsule is provided as input of the cascode, wherein the second transistor is configured as a field effect transistor (FET) and a gate connection thereof is connected to the output connection of the microphone capsule, wherein a drain connection of the second transistor is coupled to an emitter connection of the first transistor as a bipolar transistor or to a source connection of the first transistor as a FET transistor, a third transistor as a self-locking field effect transistor whose third connection is coupled to the second input connection, wherein a second connection of the third transistor is coupled via a third capacitor to the earth connection, wherein a gate connection is coupled as a first connection of the third transistor via a first resistance to the second input connection, wherein the gate connection of the third transistor is coupled to a collector connection of the first transistor as a bipolar transistor or to a drain connection of the first transistor as a FET transistor, wherein a fourth resistance is coupled between the drain connection of the second transistor and the second connection of the third transistor.

* * * * *